(12) United States Patent
Leduc et al.

(10) Patent No.: US 6,400,231 B1
(45) Date of Patent: Jun. 4, 2002

(54) NUMERICALLY CONTROLLED VARIABLE OSCILLATOR

(75) Inventors: Yves Leduc, Roquefort-les-Pins; Pascal Guignon, Callian Fayence; Pierre Carbou, Tourrettes-sur-Loup, all of (FR)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/642,481

(22) Filed: Aug. 18, 2000

(30) Foreign Application Priority Data

Mar. 31, 2000 (EP) .............................. 00400908

(51) Int. Cl.[7] .............................................. H03B 5/00
(52) U.S. Cl. ............................ 331/116 FE; 331/116 R; 331/158; 331/175; 331/177 R; 331/36 C
(58) Field of Search ...................... 331/116 FE, 116 R, 331/175, 177 R, 158, 36 C

(56) References Cited

U.S. PATENT DOCUMENTS 5,053,723 A * 10/1991 Schemmel .................... 331/14
5,511,126 A * 4/1996 Westwick .................... 331/44

\* cited by examiner

*Primary Examiner*—Arnold Kinkead
(74) *Attorney, Agent, or Firm*—Ronald O. Neerings; Wade James Brady, III; Frederick J. Telecky, Jr.

(57) ABSTRACT

An oscillator includes a resonator, such as a crystal (12) coupled to first and second capacitor banks (14). The first and second capacitor banks (14) each comprise a plurality of capacitors (16) coupled to the resonator (12) through respective switching devices (18) that may be selectively enabled. The switches (18) are selectively enabled to couple a desired set of said capacitors (16) to said resonator (12). At least one of the switches (18*sd*) is controlled with a clock signal having a programmable duty cycle from a sigma-delta modulator (20) to enable at least one of said capacitors (16*sd*) during a first phase of the clock signal and disable that capacitor (16*sd*) during a second phase of the clock signal.

13 Claims, 2 Drawing Sheets

NUMERICALLY CONTROLLED VARIABLE OSCILLATOR

CROSS-REFERENCE TO RELATED APPLICATIONS

Not Applicable

STATEMENT OF FEDERALLY SPONSORED RESEARCH OR DEVELOPMENT

Not Applicable

BACKGROUND OF THE INVENTION

1. Technical Field

This invention relates in general to integrated circuits and, more particularly, to variable oscillators.

2. Description of the Related Art

A variable oscillator, often referred to as a voltage controlled oscillator or VCO, is a circuit that produces a frequency within a specified range responsive to an input signal. Typically, the output frequency of the variable oscillator is controlled by the voltage of the input signal. In one common design for a voltage controlled oscillator, a varactor is coupled to a resonator (typically, a crystal) to produce a frequency which varies with the capacitance of the varactor.

Variable oscillators are used in a number of applications. One important application is communications, where variable oscillators are used for tuning to a specific channel in a specified frequency range. In many cases, a cellular phone circuit will use two or more variable oscillators for tuning.

Variable oscillators are one of the more expensive components in a cellular phone circuit. While many cellular phone functions are now integrated in a single chip, variable oscillators must remain outside the chip. This results in a larger and more expensive circuit. Further, currently available variable oscillators are controlled by an analog voltage signal. As a result, digital information from the DSP (digital signal processor) must be converted to an analog signal in order to control the varactor of the variable oscillator.

Therefore, a need has arisen for a variable oscillator which can be digitally controlled and which is subject to greater integration on a semiconductor circuit.

BRIEF SUMMARY OF THE INVENTION

In the present invention, an oscillator comprises a resonator having first and second terminals and first and second capacitor banks coupled to said first and second terminals, respectively. The first and second capacitor banks each comprise a plurality of capacitors coupled to the resonator through respective switching devices that may be selectively enabled. The switches are selectively enabled to couple a desired set of said capacitors to said resonator. At least one of the switches is controlled with a clock signal having a programmable duty cycle to enable at least one of said capacitors during a first phase of the clock signal and disable that capacitor during a second phase of the clock signal.

The present invention provides significant advantages over the prior art. First, the oscillator may be numerically controlled rather than voltage controlled. Second, the oscillator may be precisely tuned by adjusting the duty cycle of the signal that controls one of the switches. Third, with the exception of the crystal, all other components of the oscillator can be fabricated onto a semiconductor circuit, reducing the part count needed for many devices, such as cellular phones.

BRIEF DESCRIPTION OF THE SEVERAL VIEWS OF THE DRAWINGS

For a more complete understanding of the present invention, and the advantages thereof, reference is now made to the following descriptions taken in conjunction with the accompanying drawings, in which:

FIGS. 1a and 1b are schematic diagrams showing a numerically controlled oscillator circuit in accordance with the present invention;

FIG. 1c is a state diagram showing operation of the numerically controlled oscillator circuit of FIG. 1a.

FIG. 2 is a block diagram of a sigma-delta modulation circuit used in FIG. 1.

DETAILED DESCRIPTION OF THE INVENTION

Figures 1A, 1B, 2:
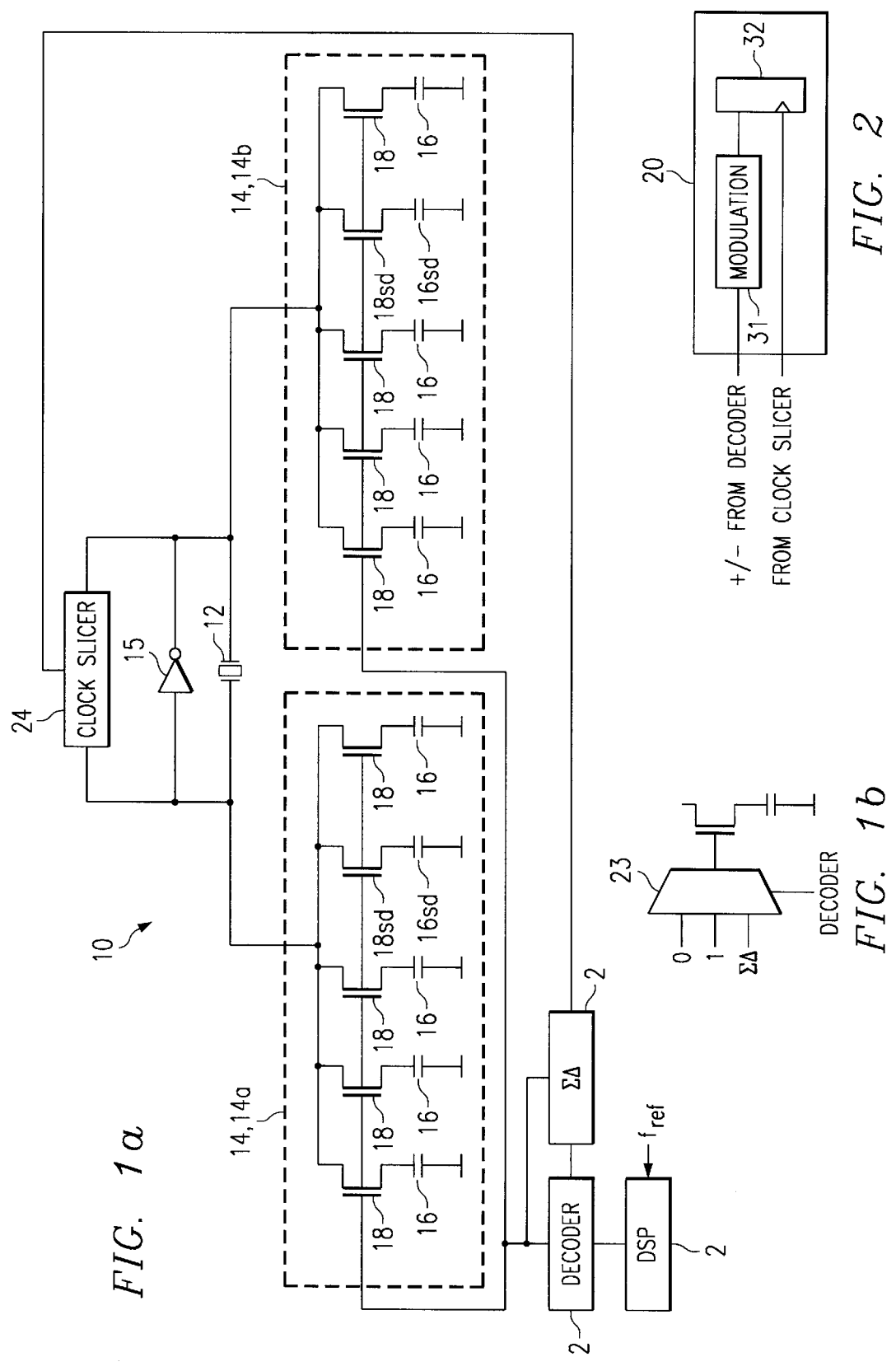
Figure 3:
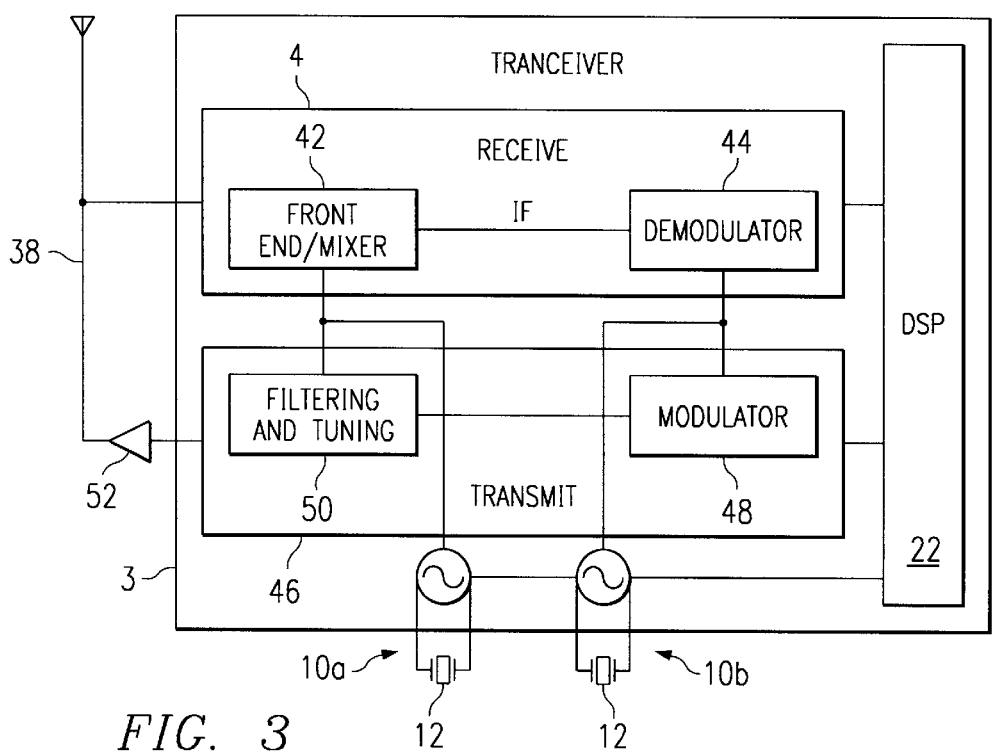
FIG. 3 is a block diagram of a cellular communications circuit using the numerically controlled oscillation circuit of FIG. 1.

The present invention is best understood in relation to FIGS. 1–3 of the drawings, like numerals being used for like elements of the various drawings.

FIG. 1a illustrates a schematic diagram of a numerically controlled variable oscillator 10. A crystal 12 is coupled between first and second capacitor banks 14 (individually referenced as capacitor banks 14a and 14b) and inverter 15. Each capacitor bank 14 includes plurality of capacitors 16, each having one plate coupled to ground. The other plate of each capacitor is selectively coupled to a terminal of crystal 12 through a respective switch 18. In the illustrated embodiment, the switch 18 is implemented using an n-channel MOS (metal over silicon) transistor.

A sigma delta modulator 20 and a decoder 25 enable or disable each capacitor 16 in a bank. As shown in conjunction with FIG. 1b, the decoder 25 controls a multiplexer 23 associated with each switch 18 having the following inputs: (1) a logical "0", (2) a logical "1" and (3) the output of the sigma delta modulator ($\Sigma\Delta$). If decoder 25 selects the "0" input, the corresponding switch 18 is disabled. If decoder 25 selects the "1" input, the corresponding switch is enabled. If the decoder 25 selects the $\Sigma\Delta$ input, the output of the sigma delta modulator is coupled to the switch 18.

In response from a signal from DSP 22 (or other logic circuit), decoder 25 provides a signal that enables a set of switches for providing the desired capacitance or as close as possible to the desired capacitance without exceeding the desired capacitance. If the capacitance is less than the desired capacitance, but enabling another capacitor would exceed the desired capacitance, the decoder couples the next capacitor in the sequence to the sigma-delta modulator 20. In FIG. 1a, the switch coupled to the sigma-delta modulator (arbitrarily chosen) is indicated by reference numeral 18sd and the associated capacitor is indicated by reference numeral 16sd. Accordingly, a "fractional" capacitor can be coupled to crystal 12; i.e., the effective capacitance of a capacitor 16sd whose associated switch 18sd is being modulated will have a capacitive value between zero and c, where c is the capacitive value of a fully enabled capacitor 16.

In operation, inverter 15 operates as a gain element in the oscillator circuit. The frequency of the oscillation is dependent upon the capacitance provided by the capacitor bank 14. The capacitance of each bank 14 is dependent upon two factors: (1) the number of switches enabled by the DSP 22 and (2) the length of the enabling portion of the pulse form sigma-delta modulator 20. Clock slicer provides a signal to sigma-delta modulator 22 that enables the pulse width modulation to switch synchronously with the oscillation to avoid amplitude modulation.

For purposes of explanation, it is assumed that all capacitors 16 are of the same capacitive value c, although designs with capacitors of different values could also be used, as would be known to one skilled in the art. Accordingly, the frequency of the oscillator 10 can be roughly tuned to a desired frequency by the DSP specifying a number k such that k*c equals the estimated total capacitance for each capacitor bank 14 to produce the desired frequency. The precision of the oscillator frequency can be improved by comparing the output frequency with a reference frequency, $f_{ref}$, and increasing or decreasing the capacitance by a single capacitor (in each bank 14) until adding an additional capacitor exceeds the desired capacitance. Adding or subtracting one capacitor (thermometric decoding) ensures monotonic operation. At this point, the sigma-delta modulator 20 is used to precisely tune the oscillator 10 to a desired frequency.

The sigma delta modulator 20 allows for a "fractional" capacitor 16sd to be added to the capacitance of the other enabled capacitors. While the other capacitors 16 will be enabled or disabled in a static manner, the fractional capacitors 16sd are enabled for a portion of a clock cycle and disabled for a portion of a clock cycle as the output of the sigma-delta modulator 20 controls switch 18sd. Averaged over time, the capacitance of the fractional capacitor 16sd in each bank will have a capacitance equal to c*d, where d is the duty cycle of the clock wave output from the sigma-delta modulator. For example, for a 50% duty cycle, the capacitance of the fractional capacitor 16sd will be 0.5c. Importantly, the duty cycle of the clock signal from the sigma-delta modulator 20 is variable, so that the capacitance of each bank can be varied such that the output of the oscillator 10 can be precisely matched to the reference frequency, $f_{ref}$.

In the preferred embodiment, in order to guarantee the montonicity of the capacitance associated with each bank, capacitors 16 are enabled in a predetermined sequence as the desired capacitance increases and are disabled in the reverse sequence as the desired capacitance decreases. For an increasing capacitance, prior to a transition from a fully disabled to a fully enabled state, a capacitor would be in a modulated state. Similarly, for a decreasing capacitance, prior to a transition from a fully enabled state to a fully disabled state, a capacitor would be in a modulated state. This guarantees that variations in the capacitive value of each capacitor 16 will not lead to a progression where the capacitive value of the bank 14 inadvertently increases during a desired decrease in capacitance or where the capacitive value of the bank inadvertently decreases during a desired increase in capacitance.

Figure 1C:
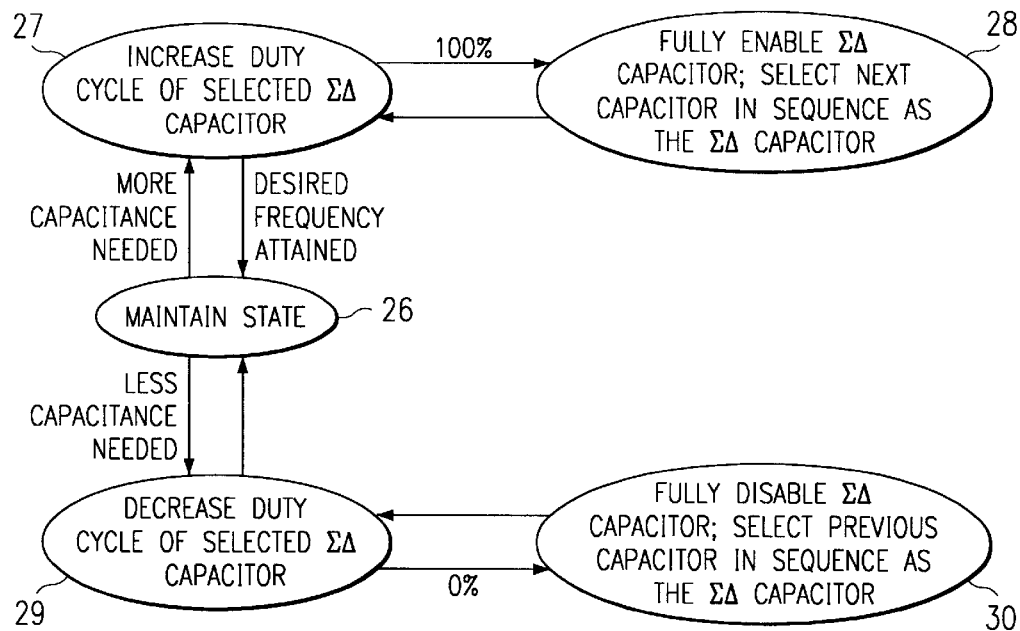

A state diagram illustrating the enabling, modulating and disabling of switches 18 is shown in FIG. 1c. In state 26, the oscillator 10 is producing a desired frequency. If the DSP detects that the frequency from the oscillator varies from a desired frequency, it can increase or decrease the capacitance in the banks 14. If additional capacitance is needed, the state transitions to state 27, where the duty cycle of the $\Sigma\Delta$ modulation is increased, thereby increasing the amount of capacitance associated with the corresponding capacitor 16sd. The duty cycle is increased until one of two events occurs. First, if the desired frequency is attained, control returns to state 26 and the duty cycle is maintained at its last value. Second, if the duty cycle reaches 100%, the formerly modulated capacitor 16 is fully enabled (i.e., the decoder 25 passes a logical "1" to the corresponding switch 18) and the next capacitor in the sequence is set to $\Sigma\Delta$ modulation in state 28. Control then returns to state 27 where the duty cycle is increased until the desired frequency is attained or the duty cycle once again reaches 100%.

Similarly, if less capacitance is needed from a state 26 of desired frequency, the state transitions to state 29, where the duty cycle of the $\Sigma\Delta$ modulation is decreased, thereby decreasing the amount of capacitance associated with the corresponding capacitor 16sd. The duty cycle is decreased until one of two events occurs. First, if the desired frequency is attained, control returns to state 26 and the duty cycle is maintained at its last value. Second, if the duty cycle reaches 0%, the formerly modulated capacitor 16 is fully disabled (i.e., the decoder 25 passes a logical "0" to the corresponding switch 18) and the previous capacitor in the sequence is set to $\Sigma\Delta$ modulation in state 30. Control then returns to state 29 where the duty cycle is decreased until the desired frequency is attained or the duty cycle once again reaches 0%.

FIG. 2 illustrates a preferred embodiment for the generation of the output of the sigma-delta modulator 20. The modulator 31 produces a clock signal having a set period. The duty cycle of the clock signal can be increased or decreased responsive to a signal from the decoder 25. The output of modulator 31 is input to latch 32, which is clocked by the output of clock slicer 24. Clock slicer 24 is a comparator that receives the sine wave output of oscillator 10 and generates a synchronization signal at the maximum amplitude of the signal. This causes the output of sigma-delta generator 20 to change synchronously with the output of the oscillator 10 to avoid amplitude modulation. The decision to switch the fractional capacitor on or off is made on the same edge of the output (rising or falling, but not on both).

FIG. 3 illustrates a block diagram of the numerically controlled oscillator 10 used in a cellular communications transceiver circuit 36. Signals are received and transmitted on antenna 39. The receive circuitry 40 receives signals from the antenna in a front end/mixer circuit 42. The front end/mixer circuit 42 conditions the signal (using low noise amplification and filtering) and mixes the signal with the output of RF (radio frequency) numerically controlled oscillator (NCO) 10a, such that the frequency from NCO 10a is added to or subtracted from the frequency of the received signal. This produces the intermediate frequency (IF) signal, which is demodulated using demodulation circuitry 44, based on the output of IF NCO 10b. Demodulated data is transmitted to DSP 22. The design shown in FIG. 1 could be used for both RF NCO 10a and IF NCO 10b. If the series resistance of the switches would be too high in the case of the RF NCO, a standard VCO could be used.

Similarly, data from DSP 22 is output on antenna 38 via transmit circuitry 46. Data from the DSP 22 is modulated by modulator 48 in conjunction with the frequency from IF NCO 10b. The modulated data is received by filtering and tuning circuitry 50, which conditions the data for broadcast at a frequency determined by RF NCO 10a. The output of filtering and tuning circuitry 50 is amplified by power amplifier 52. The frequencies from NCOs 10a and 10b can be controlled by DSP 22, as described in connection with FIG. 1.

The transceiver circuitry 36, including the numerically controlled oscillators can be implemented on a single integrated circuit, with the exception of the crystals. In a typical communication application, each capacitor bank 14 could contain 256 capacitors, although more or less could be used as desired.

The present invention provides significant advantages over the prior art. First, the oscillator may be numerically controlled rather than voltage controlled. Second, the oscillator may be precisely tuned by adjusting the duty cycle of the signal that controls one of the switches. Third, with the exception of the crystal, all other components of the oscillator can be fabricated onto a semiconductor circuit, reducing the part count needed for many devices, such as cellular phones. This results in less expensive communication devices.

Although the Detailed Description of the invention has been directed to certain exemplary embodiments, various modifications of these embodiments, as well as alternative embodiments, will be suggested to those skilled in the art. The invention encompasses any modifications or alternative embodiments that fall within the scope of the claims.

What is claimed is:

1. An oscillator comprising:

a resonator having first and second terminals;

first and second capacitor banks coupled to said first and second terminals, respectively, said first and second capacitor banks each comprising a plurality of capacitors coupled to said resonator through respective switching devices that may be selectively enabled;

circuitry for selectively enabling said switching devices to couple a desired set of said capacitors to said resonator, including circuitry for generating a clock signal having a programmable duty cycle to enable at least one of said switching devices during a first phase of the clock signal and disable said at least one switching device during a second phase of the clock signal; and a clock slicer coupled to said resonator for generating a synchronization signal responsive to the signal across said resonator, wherein said clock slicer generates said synchronization signal at the maximum amplitude of said signal across said resonator and further wherein said circuitry for generating a clock signal having a programmable duty cycle is responsive to the synchronization signal to cause said enabling and disabling of said at least one switching device to occur synchronously with said signal across said resonator to avoid amplitude modulation.

2. The oscillator of claim 1 wherein said resonator is a crystal.

3. The oscillator of claim 1 wherein said clock signal switches between said first and second phases on an active edge of said synchronization signal.

4. The oscillator of claim 1 and further comprising a decoder coupled to said capacitor banks for selectively enabling one or more of said switching devices each bank.

5. The oscillator of claim 4 wherein said decoder varies the capacitance associated with said capacitor banks by enabling or disabling one switching device at a time.

6. The oscillator of claim 5 wherein said decoder varies the capacitance associated with said capacitor banks by enabling or disabling one switching device at a time in a predetermined sequence.

7. The oscillator of claim 1 wherein said switching devices comprise MOS transistors.

8. A method of producing a signal at a desired frequency, comprising the steps of:

providing a resonator having first and second terminals;

providing first and second capacitor banks coupled said to first and second terminals, respectively, said first and second capacitor banks each comprising a plurality of capacitors coupled to said resonator through respective switching devices that may be selectively enabled;

selectively enabling said switching devices to couple a desired set of said capacitors to said resonator;

generating a clock signal having a programmable duty cycle to enable at least one of said switching devices during a first phase of the clock signal and disable said at least one switching device during a second phase of the clock signal; and generating a synchronization signal responsive solely to the maximum amplitude of the signal across said resonator to cause said enabling and disabling of said at least one switching device to occur synchronously with said signal across said resonator to avoid amplitude modulation.

9. The method of claim 8 wherein said step of providing a resonator comprises the step of providing a crystal.

10. The method of claim 8 and further comprising the step of switching said clock signal between said first and second phases on an active edge of said synchronization signal.

11. The method of claim 8 and further comprising the step of selectively enabling one or more of said switching devices in each bank responsive to the output of a dcoder.

12. The method of claim 11 wherein selectively enabling step comprises the step of enabling or disabling one switching device at a time in each capacitor bank.

13. The method of claim 12 wherein said step of enabling or disabling comprises the step of enabling or disabling one switching device at a time in a predetermined sequence.

* * * * *